(12) United States Patent
Yang et al.

(10) Patent No.: US 10,886,201 B2
(45) Date of Patent: Jan. 5, 2021

(54) POWER DEVICE HAVING A SUBSTRATE WITH METAL LAYERS EXPOSED AT SURFACES OF AN INSULATION LAYER AND MANUFACTURING METHOD THEREOF

(71) Applicant: EPISTAR CORPORATION, Hsinchu (TW)

(72) Inventors: Shu-Han Yang, Hsinchu (TW); Sheng-Che Chiou, Hsinchu (TW); Jai-Tai Kuo, Hsinchu (TW); Po-Chang Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 1 day.

(21) Appl. No.: 15/897,833

(22) Filed: Feb. 15, 2018

(65) Prior Publication Data
US 2019/0252301 A1    Aug. 15, 2019

(51) Int. Cl.
*H01L 23/495*    (2006.01)
*H01L 23/31*    (2006.01)
(Continued)

(52) U.S. Cl.
CPC .... *H01L 23/49541* (2013.01); *H01L 21/4828* (2013.01); *H01L 21/50* (2013.01); *H01L 23/3107* (2013.01); *H01L 23/49575* (2013.01); *H01L 23/49586* (2013.01); *H01L 23/49838* (2013.01); *H01L 23/49861* (2013.01); *H01L 25/072* (2013.01); *H01L 23/3121* (2013.01); *H01L 24/48* (2013.01);
(Continued)

(58) Field of Classification Search
CPC . H01L 23/495–49596; H01L 23/49861; H01L 21/4821–4842; H01L 23/49575; H01L 25/072; H01L 23/49589; H01L 29/66431; H01L 29/66462; H01L 29/778–7787; H01L 2924/13064; H01L 23/49583; H01L 23/49541; H01L 23/49838; H01L 23/49579–49586; H01L 23/49582; H01L 25/071; H01L 25/074; H01L 25/112–117; H01L 23/49558; H01L 23/49548
See application file for complete search history.

(56) References Cited

U.S. PATENT DOCUMENTS 8,461,694 B1    6/2013 Sirinorakul
9,774,301 B1*   9/2017 Maalouf ............... H03F 1/0288
(Continued)

*Primary Examiner* — Younes Boulghassoul
(74) *Attorney, Agent, or Firm* — Ditthavong & Steiner P.C.

(57) ABSTRACT

A substrate includes a first metal layer, a second metal layer, a third metal layer and an insulation layer surrounding the first metal layer, the second metal layer and the third metal layer. The first power component is electrically connected to the first metal layer. The second power component is electrically connected to the second metal layer. The shortest distance between the first metal layer exposed to a second surface of the insulation layer and the second metal layer exposed to the second surface is a first distance, the shortest distance between a first metal layer of the insulation layer exposed to the first surface and the second metal layer exposed to the first surface is a second distance, and a ratio value of the first distance to the second distance ranges between 1.25 and 1.4.

17 Claims, 20 Drawing Sheets

(51) Int. Cl.
  *H01L 21/48* (2006.01)
  *H01L 21/50* (2006.01)
  *H01L 23/498* (2006.01)
  *H01L 25/07* (2006.01)
  *H01L 23/00* (2006.01)
  *H01L 29/778* (2006.01)
  *H01L 27/088* (2006.01)

(52) U.S. Cl.
  CPC ........ *H01L 27/0883* (2013.01); *H01L 29/778* (2013.01); *H01L 2924/13091* (2013.01)

(56) References Cited

U.S. PATENT DOCUMENTS

| | | | | |
|---|---|---|---|---|
| 2008/0290486 | A1* | 11/2008 | Chen | H01L 21/4828 257/676 |
| 2010/0258925 | A1* | 10/2010 | Jeon | H01L 24/97 257/676 |
| 2011/0049580 | A1* | 3/2011 | Lui | H01L 23/49575 257/262 |
| 2014/0110796 | A1* | 4/2014 | Cho | H01L 25/16 257/401 |
| 2014/0127861 | A1* | 5/2014 | Fernando | H01L 24/97 438/112 |
| 2014/0167060 | A1* | 6/2014 | Santangelo | H01L 27/098 257/76 |
| 2014/0231829 | A1* | 8/2014 | Kanazawa | H01L 29/8083 257/77 |
| 2014/0345931 | A1 | 11/2014 | Huang | |
| 2014/0374801 | A1* | 12/2014 | Ikeda | H01L 23/49575 257/195 |
| 2015/0041984 | A1* | 2/2015 | Otremba | H01L 23/49524 257/773 |
| 2016/0104665 | A1* | 4/2016 | Cho | H01L 28/10 257/666 |
| 2016/0104697 | A1* | 4/2016 | Cho | H01L 23/04 257/195 |
| 2016/0190114 | A1* | 6/2016 | Huang | H01L 25/0655 257/76 |
| 2016/0260656 | A1* | 9/2016 | Hwang | H01L 23/49503 |
| 2017/0025336 | A1* | 1/2017 | Padmanabhan | H01L 23/49503 |
| 2017/0025338 | A1* | 1/2017 | Padmanabhan | H01L 25/50 |
| 2017/0317015 | A1* | 11/2017 | Lee | H01L 23/49503 |
| 2018/0286792 | A1* | 10/2018 | Gajda | H01L 24/40 |
| 2019/0043825 | A1* | 2/2019 | Yamaguchi | H01L 29/205 |
| 2019/0279948 | A1* | 9/2019 | Moreau | H03K 17/102 |

* cited by examiner

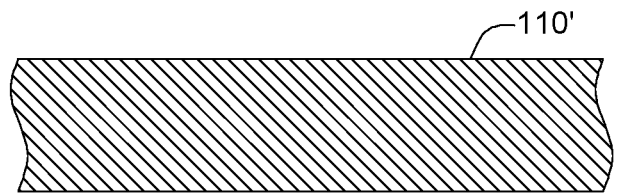
FIG. 12A
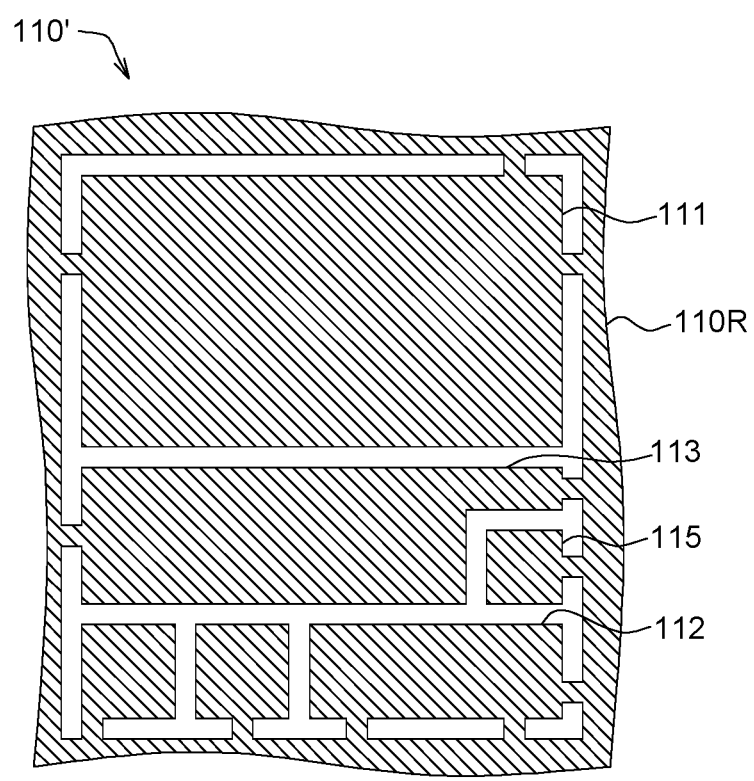
FIG. 12B1

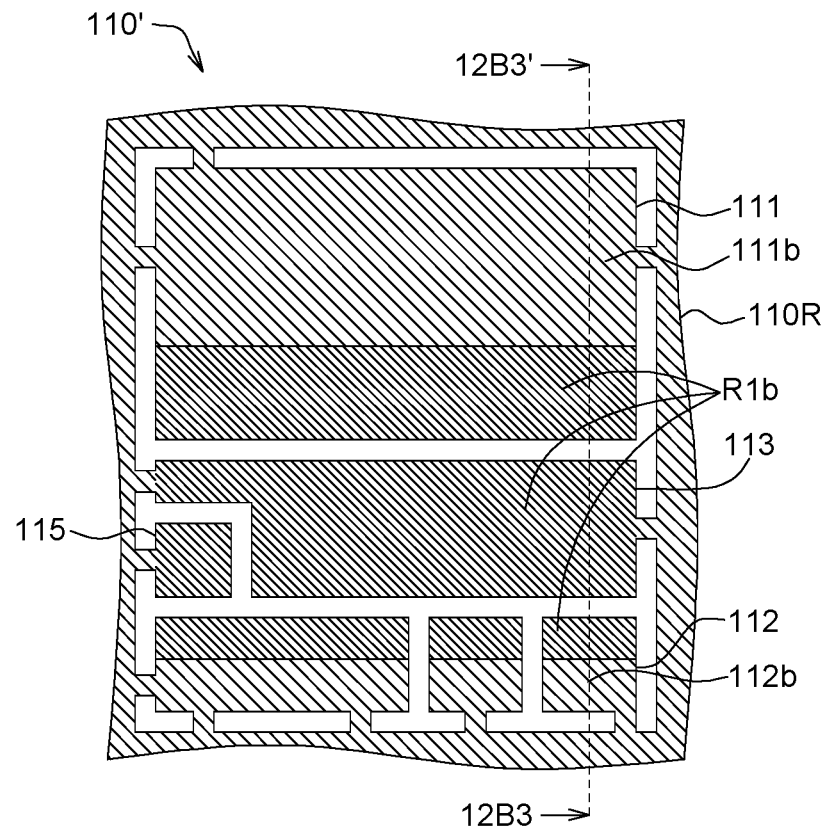
FIG. 12B2
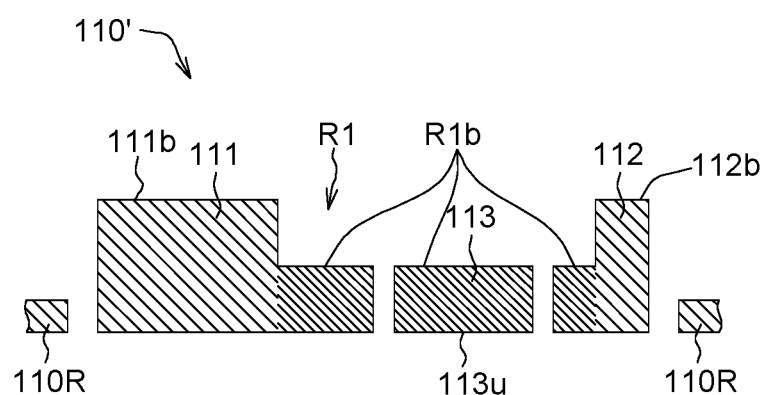
FIG. 12B3

POWER DEVICE HAVING A SUBSTRATE WITH METAL LAYERS EXPOSED AT SURFACES OF AN INSULATION LAYER AND MANUFACTURING METHOD THEREOF

TECHNICAL FIELD

The disclosure relates in general to a power device having an insulation layer and a manufacturing method thereof, and more particularly to a power device and a manufacturing method thereof.

BACKGROUND

Conventional power device may be manufactured as a PQFN (Plastic Quad Flat Pack No-lead) package including several leads and a molding compound encapsulating the leads, wherein the leads are exposed to a lateral surface of the molding compound. However, the exposed leads easily fall off from the molding compound. Thus, how to protect the exposed leads is an important issue.

SUMMARY

According to one embodiment, a power device is provided. The power device includes a substrate, a first power component and a second power component. The substrate includes a first metal layer, a second metal layer, a third metal layer and an insulation layer surrounding the first metal layer, the second metal layer and the third metal layer, wherein the insulation layer has a first surface and a second surface opposite to the first surface. The first power component is electrically connected to the first metal layer. The second power component is electrically connected to the second metal layer. The shortest distance between the first metal layer exposed to the second surface and the second metal layer exposed to the second surface is a first distance, the shortest distance between the first metal layer exposed from the first surface and the second metal layer exposed from the first surface is a second distance, and a ratio value of the first distance to the second distance ranges between 1.25 and 1.4.

According to another embodiment, a manufacturing method of a power device is provided. The manufacturing method includes the following steps. A substrate is provided, wherein the substrate has a first metal layer, a second metal layer, a third metal layer and an insulation layer surrounding the first metal layer, the second metal layer and the third metal layer. The insulation layer has a first surface and a second surface opposite to the first surface, wherein the shortest distance between the first metal layer exposed to the second surface and the second metal layer exposed to the second surface is a first distance, the shortest distance between the first metal layer exposed to the first surface and the second metal layer exposed to the first surface is a second distance, and a ratio value of the first distance to the second distance ranges between 1.25 and 1.4. A first power component is disposed to be electrically connected to the first metal layer. A second power component is disposed to be electrically connected to the second metal layer.

According to another embodiment, a manufacturing method of a power device is provided. The manufacturing method includes the following steps. A metal substrate is provided; the metal substrate is etched to form a first metal layer, a second metal layer, and a third metal layer; a first power component is disposed to be electrically connected to the first metal layer; and a second power component is disposed to be electrically connected to the second metal layer.

BRIEF DESCRIPTION OF THE DRAWINGS

FIGS. 12A to 12E illustrate manufacturing processes of the power device in FIG. 2A.

Figure 1A:
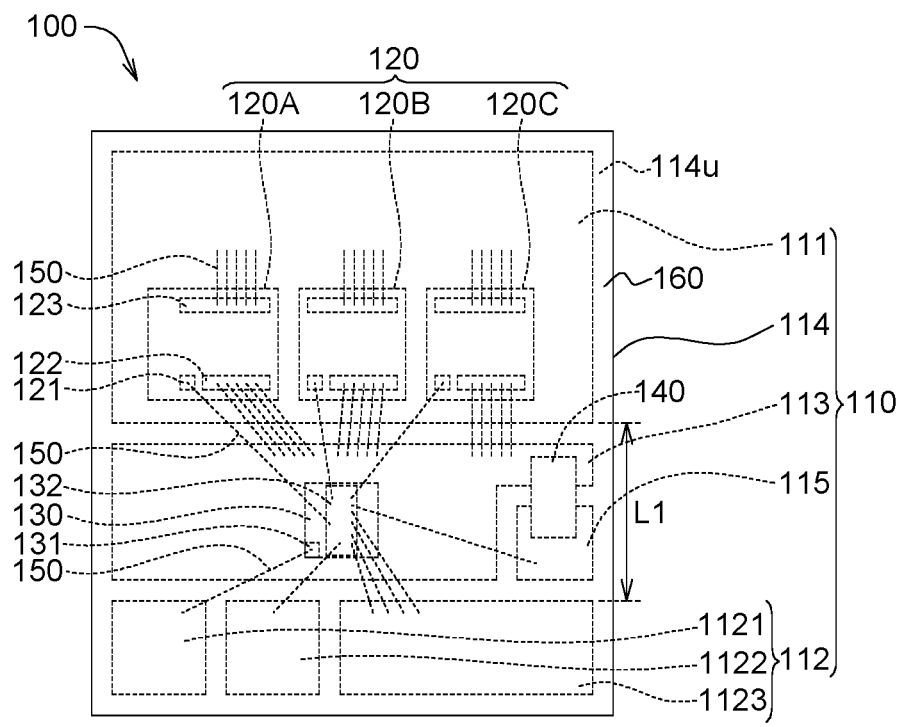
FIG. 1A illustrates a top view of a power device according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed.

Figure 1B:
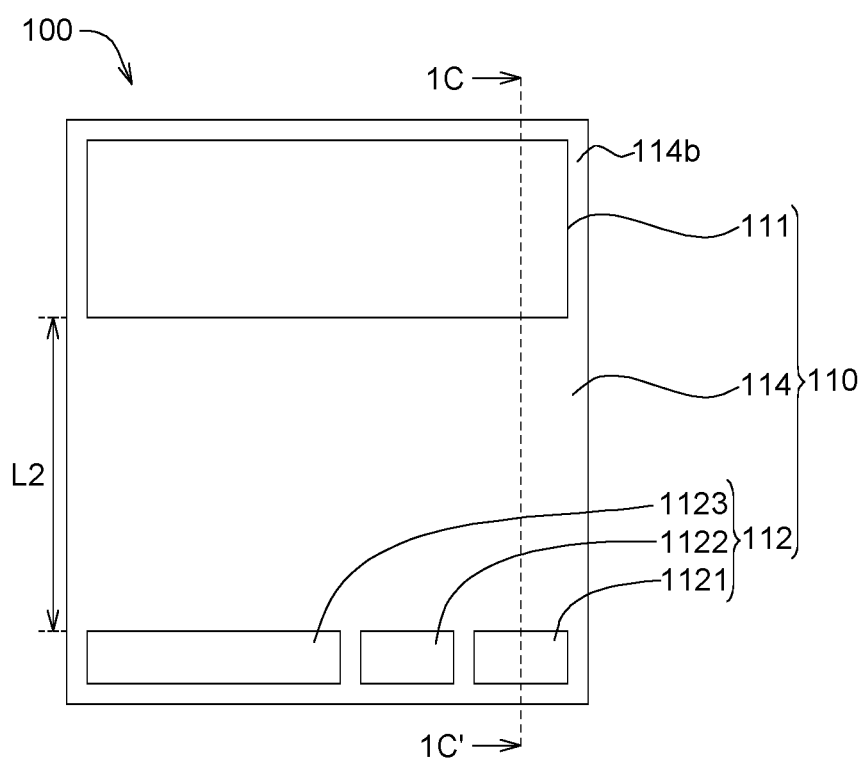
FIG. 1B illustrates a bottom view of the power device in FIG. 1A.
Figure 1C:
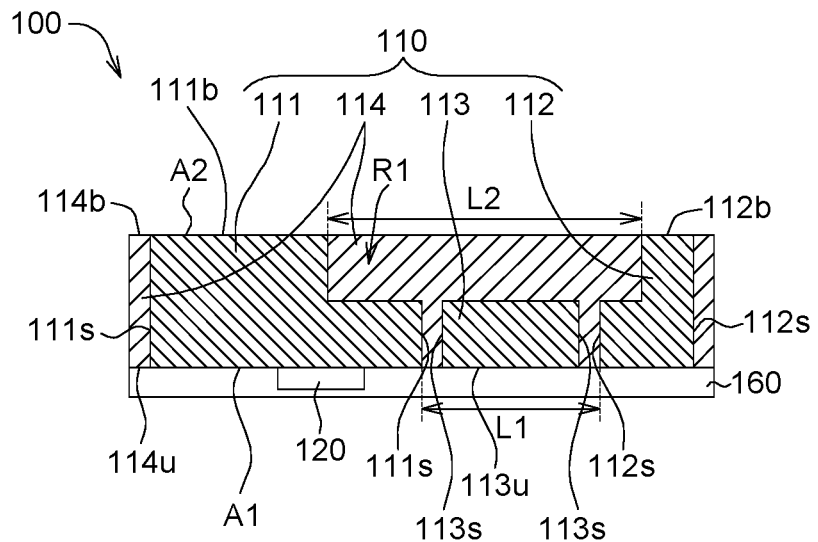
FIG. 1C illustrates a cross sectional view of the power device along a direction 1C-1C' in FIG. 1B.

Referring to FIGS. 1A to 1C, FIG. 1A illustrates a top view of a power device 100 according to one embodiment, FIG. 1B illustrates a bottom view of the power device 100 in FIG. 1A, and FIG. 1C illustrates a cross sectional view of the power device 100 in FIG. 1B along a direction 1C-1C'.

The power device 100 has one or more first power components 120, one or more second power components 130, and one or more passive electronic device 140. The first power component 120 can be a high electron mobility transistor (HEMT), and the second power component 130 can be a metal-oxide-semiconductor FET (MOSFET), such as a low voltage MOS. In another embodiment, the first power component 120 may be a D-mode (Depletion mode) HEMT, and the second power component 130 may be an E-mode (Enhancement mode) MOS.

In the embodiment shown in FIGS. 1A~1C, the power device 100 has a substrate 110, three first power component 120A~120C, a second power component 130, a passive electronic device 140, a plurality of bonding wires 150 and a protection layer 160.

As shown in FIG. 1A, the first power component 120 has a first pad 121, a second pad 122 and a third pad 123. The second power component 130 has a first pad 131, a second pad 132 and a third pad (disposed on a bottom surface of the second power component 130). The first pad 121, the second pad 122 and the third pad 123 of the first power component 120 are configured as a gate electrode, a source electrode and a drain electrode respectively. The first pad 131, the second pad 132 and the third pad of the second power component 130 are configured as a gate electrode, a source electrode and a drain electrode respectively.

The substrate 110 has a first metal layer 111, a second metal layer 112, a third metal layer 113, a fourth metal layer 115 and an insulation layer 114 surrounding the first metal layer 111, the second metal layer 112, the third metal layer 113 and the fourth metal layer 115. The insulation layer 114 has a first surface 114u and a second surface 114b opposite to the first surface 114u. In an embodiment, the contour of the third metal layer 113 can be a rectilinear polygon. The interior angle at each vertex of the rectilinear polygon is either 90° or 270° and the number of sides in the rectilinear polygon is equal to or larger than 4.

The second metal layer 112 includes a first segment 1121, a second segment 1122 and a third segment 1123. The first segment 1121, the second segment 1122 and the third segment 1123 are separated from each other by the insulation layer 114. In the present embodiment, the first segment 1121 may serve as a gate electrode of the power device 100, the second segment 1122 may serve as a kelvin electrode of the power device 100, and the third segment 1123 may serve as a source electrode of the power device 100. In addition, the first metal layer 111 may serve as a drain electrode of the power device 100. In an embodiment, in a top view, a top-viewed area of the first metal layer 111 is larger than a top-viewed area of the third segment 1123, and the top-viewed area of the third segment 1123 is larger than a top-viewed area of the first segment 1121.

The connections between the third pad 123 and the first metal layer 111, the connections between the second pad 122 and the third metal layer 113 and the connections between the second pad 132 and the third segment 1123 of the second metal layer 112 need sufficient number of the bonding wire 150 for withstanding larger current, higher voltage to improve the durability and reliability of the overall power device 100.

However, in the present embodiment and the following embodiment, the number of the bonding wire 150 arranged to connect the pad with the corresponding metal layer depends on the amount of current and the amount of the voltage applying to the pad and the corresponding metal layer. To be more specific, the larger voltage or current applied, the more bonding wires are arranged in the power device 100.

As shown in FIG. 1A, the first pad 121, the second pad 122 and the third pad 123 of the first power component 120 are electrically connected to the second power component 130, the third metal layer 113 and the first metal layer 111 through the corresponding bonding wires 150. The third pad of the second power component 130 is formed between the third metal layer 113 and the second power component 130. In addition, the third pad of the second power component 130 is electrically connected to the third metal layer 113. The first pad 131 and the second pad 132 are electrically connected to the second metal layer 112 and the first power component 120 through the corresponding bonding wires 150. The passive electronic device 140 is disposed above the third metal layer 113 and the fourth metal layer 115, and electrically connected to the third metal layer 113 and the fourth metal layer 115. The passive electronic device 140 may be selected from capacitors, inductors and resistors. The first metal layer 111, the second metal layer 112, the third metal layer 113 and the fourth metal layer 115 are separated from each other and connected by the insulation layer 114.

The first power component 120 is electrically connected to the first metal layer 111. The second power component 130 is electrically connected to the second metal layer 112. The passive electronic device 140 is disposed on the third metal layer 113. The shortest distance between the first metal layer 111 and the second metal layer 112 is a first distance L1. Referring to FIG. 1B, the shortest distance between the first metal layer 111 and the second metal layer 112 is a second distance L2. A ratio value of the second distance L2 to the first distance L1 ranges between 1.25 and 1.4.

Due to the first distance L1 being shorter than the second distance L2, the first power component 120 disposed on the first metal layer 111 exposed to the first surface 114u is closer to the second metal layer 112, and the length of the bonding wire 150 connecting the first power component 120 with the third metal layer 113 can be shorter compared with the device having same first distance and second distance. Therefore, the possibility of the bonding wire to be broke during manufacturing or operation can be reduced.

Due to the insulation layer 114 surrounds the first metal layer 111, the second metal layer 112, the third metal layer 113 and the fourth metal layer 115, it can prevent the lateral surfaces of the metal layers from being exposed to the ambient, and the lateral surfaces of the metal layers can be protected by the insulation layer 114. As a result, the first metal layer 111, the second metal layer 112, the third metal layer 113 and the fourth metal layer 115 are not easy to fall off from the power device 100.

In the present embodiment, the substrate 110 is a pre-molding substrate. The insulation layer 114 is a molding compound. The material of the insulation layer 114 can be epoxy, resin, moldable polymer, or the like. In an embodiment, the material of the insulation layer 114 can be an ultraviolet (UV) cured polymer or a thermally cured polymer applied in a form of gel or malleable solid, and then be cured through a UV or thermal curing process. In an embodiment, the insulation layer 114 may be cured with a mold (not shown).

As shown in FIG. 1C, the first metal layer 111 has a lateral surface 111s, the second metal layer 112 has a lateral surface 112s, and the third metal layer 113 has a lateral surface 113s. The insulation layer 114 covers the entire of the lateral surfaces the lateral surface 111s, the lateral 112s and the lateral surface 113s.

As shown in FIG. 1C, the first metal layer 111 and the second metal layer are exposed to the first surface 114u and the second surface 114b. The third metal layer 113 is exposed to the first surface 114u, but is not exposed to the second surface 114b.

As shown in FIG. 1C, the first metal layer 111 has a first area A1 exposed to the first surface 114u and a second area A2 exposed to the first surface 114u, the first area A1 is larger than the second area A2. In an embodiment, the first area A1 may be smaller than the second area A2. A cavity R1 extends toward a first surface 113u of the third metal layer 113 from a second surface 111b of the first metal layer 111 and a second surface 112b of the second metal layer 112. The cavity R1 may be formed by half-etched technology, for example.

As shown in FIGS. 1A and 1C, the protection layer 160 is formed on the first surface 114u of the insulation layer 114 and covers the first power components 120, the second power component 130, the passive electronic device 140 and the bonding wires 150 to protect these components. In addition, the protection layer 160 may include Polyimide (PI) or epoxy.

Figure 2A:
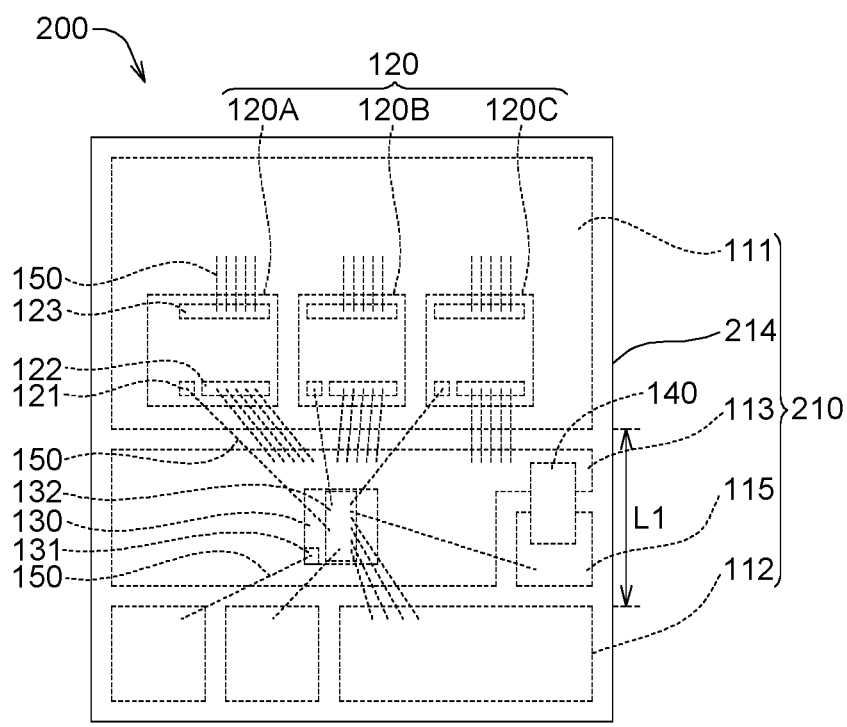
FIG. 2A illustrates a top view of a power device according to another embodiment.
Figure 2B:
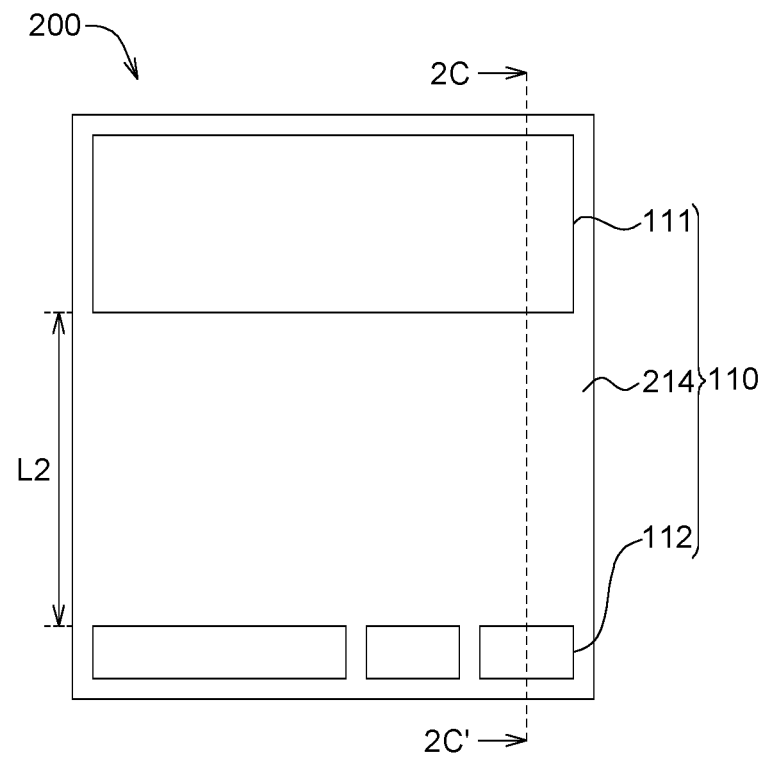
FIG. 2B illustrates a bottom view of the power device in FIG. 2A.
Figure 2C:
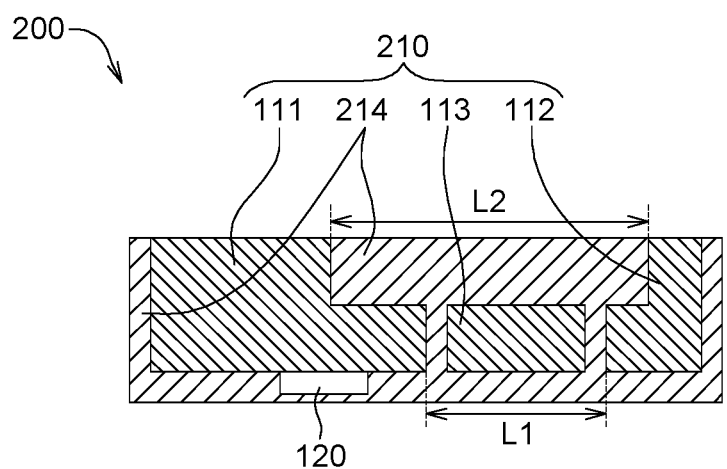
FIG. 2C illustrates a cross sectional view of the power device along a direction 2C-2C' in FIG. 2B.

Referring to FIGS. 2A to 2C, FIG. 2A illustrates a top view of a power device 200 according to another embodiment, FIG. 2B illustrates a bottom view of the power device 200 in FIG. 2A, and FIG. 2C illustrates a cross sectional view of the power device 200 along a direction 2C-2C' in FIG. 2B.

The power device 200 includes a substrate 210, at least one first power component 120, at least one second power component 130, the passive electronic device 140 and a plurality of bonding wires 150.

Referring to FIG. 2B, the substrate 210 includes the first metal layer 111, the second metal layer 112, the third metal layer 113, the fourth metal layer 115 and an insulation layer 214 surrounding the first metal layer 111, the second metal layer 112, the third metal layer 113 and the fourth metal layer 115. In an embodiment, the contour of the third metal layer 113 can be a rectilinear polygon. The interior angle at each vertex of the rectilinear polygon is either 90° or 270° and the number of sides in the rectilinear polygon is equal to or larger than 4. In the present embodiment, the insulation layer 214 covers the first power components 120, the second power component 130, the passive electronic device 140 and the bonding wires 150 to protect these components. In this situation, the protection layer 160 shown in FIG. 1C is omitted. However, in another embodiment, the power device 200 further includes the protection layer 160 covering the first power components 120, the second power component 130 and the passive electronic device 140, wherein the protection layer 160 covers the insulation layer 214.

Figure 3A:
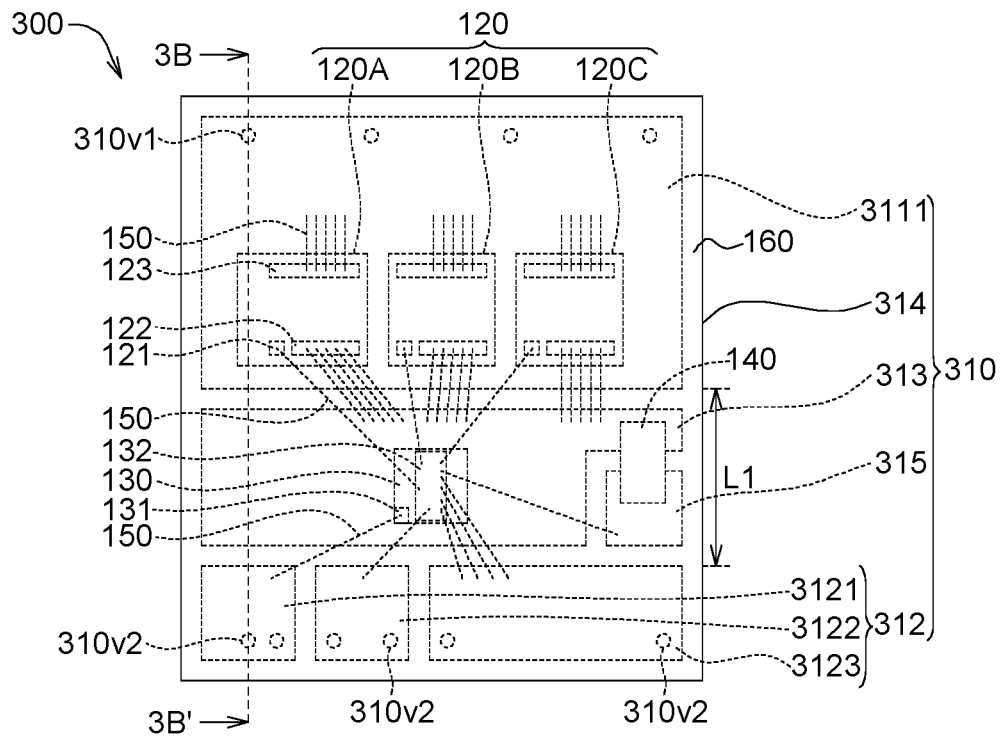
FIG. 3A illustrates a top view of a power device according to another embodiment.
Figure 3B:
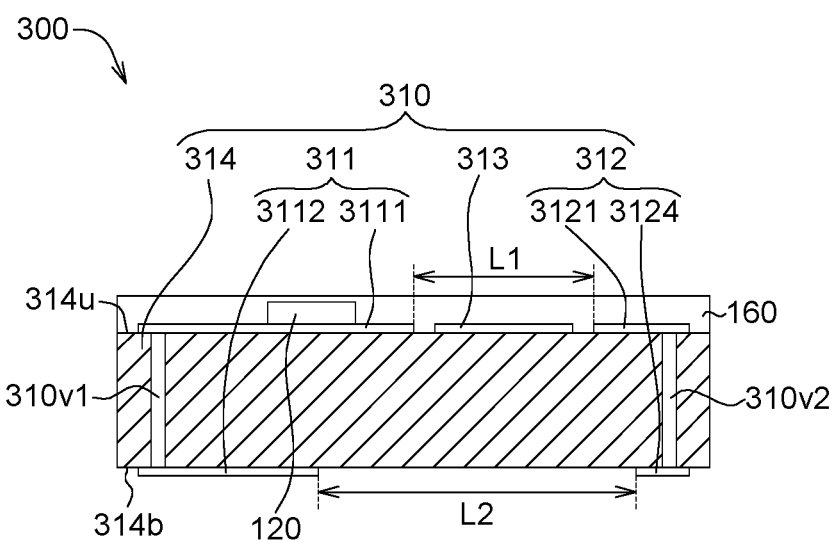
FIG. 3B illustrates a cross sectional view of the power device along a direction 3B-3B' in FIG. 3A.

Referring to FIGS. 3A to 3B, FIG. 3A illustrates a top view of a power device 300 according to another embodiment, and FIG. 3B illustrates a cross sectional view of the power device 300 in FIG. 3A along a direction 3B-3B'.

The power device 300 includes a substrate 310, at least one first power component 120, at least one second power component 130, the passive electronic device 140, a plurality of bonding wires 150 and the protection layer 160.

The substrate 310 includes a first metal layer 311, a second metal layer 312, a third metal layer 313, an insulation layer 314, a fourth metal layer 315, at least one first conductive via 310v1 and at least one second conductive via 310v2. The insulation layer 314 has a first surface 314u and a second surface 314b opposite to the first surface 314u. In an embodiment, the contour of the third metal layer 313 can be a rectilinear polygon. The interior angle at each vertex of the rectilinear polygon is either 90° or 270° and the number of sides in the rectilinear polygon is larger than 4.

In the present embodiment, the insulation layer 314 is a ceramic layer. Referring to FIG. 3B, the first metal layer 311 includes a first upper portion 3111 formed on the first surface 314u and a first lower portion 3112 formed on the second surface 314b, and the first upper portion 3111 and the first lower portion 3112 are electrically connected with each other through the first conductive via 310v1.

The second metal layer 312 includes a first upper segment 3121, a second upper segment 3122 and a third upper segment 3123. The first upper segment 3121, the second upper segment 3122 and the third upper segment 3123 are formed on the first surface 314u. The first upper segment 3121, the second upper segment 3122 and the third upper segment 3123 are separated from each other.

In addition, the second metal layer 312 further includes a first lower segment 3124. The first lower segment 3124 is formed on the second surface 314b, and the first upper segment 3121 and the first lower segment 3124 are electrically connected with each other through the second conductive via 310v2. The third metal layer 313 is formed on the first surface 314u. Furthermore, the second metal layer 312 further includes a second lower segment (not illustrated) formed on the second surface 314b and a third lower segment (not illustrated) formed on the second surface 314b, wherein the second upper segment 3122 and the second lower segment are electrically connected with each other through the second conductive via 310v2 (illustrated in FIG. 3A), and the third upper segment 3123 and the third lower segment are electrically connected with each other through the second conductive via 310v2 (illustrated in FIG. 3A).

In an embodiment, the first lower segment 3124 electrically connected to the first upper segment 3121 may serve as a gate electrode of the power device 300, the second lower segment electrically connected to the second upper segment 3122 may serve as a kelvin electrode of the power device 300, the third lower segment electrically connected to the third upper segment 3123 may serve as a source electrode of the power device 300, and the first lower portion 3112 may serve as a drain electrode of the power device 300 The gate electrode and the kelvin electrode are used to receive the gate control signal of the power device 300. The drain electrode and the source electrode are used to receive the turn-on current of the power device 300. In another embodiment, the kelvin electrode and the source electrode are connected to ground.

As shown in FIG. 3B, the shortest distance between the first lower portion 3112 and the first lower segment 3124 is the second distance L2, the shortest distance between the first upper portion 3111 and the first upper segment 3121 is the first distance L1, and the ratio value of the first distance L2 to the second distance L1 ranges between 1.25 and 1.4.

Due to the first distance L1 being shorter than the second distance L2, the first power component 120 disposed on the first upper portion 3111 exposed to the first surface 314u is closer to the second metal layer 112, and thus the length of the bonding wire 150 connecting the first power component 120 with the third metal layer 113 is shorter.

Figure 4A:
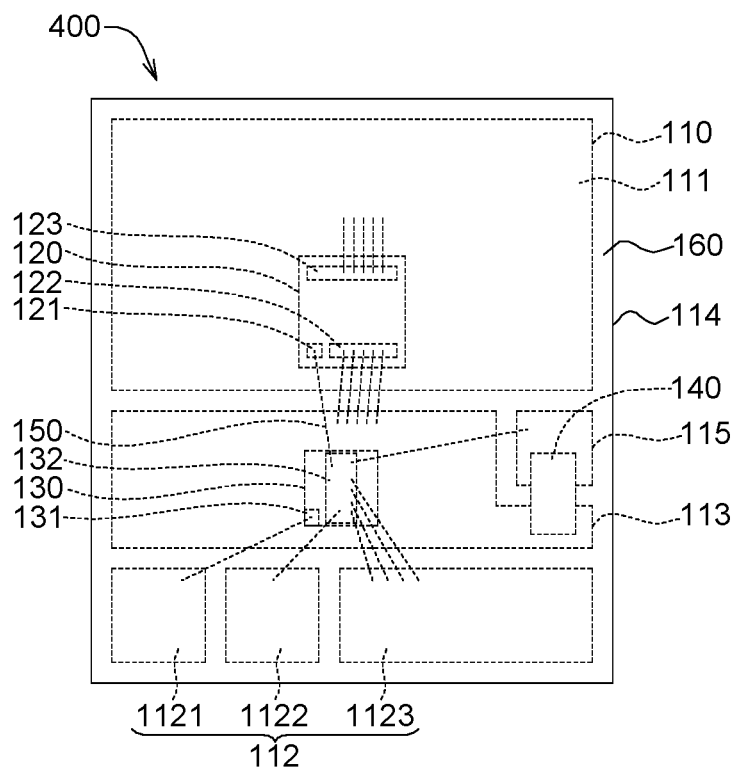
FIG. 4A illustrates a top view of a power device according to another embodiment.
Figure 4B:
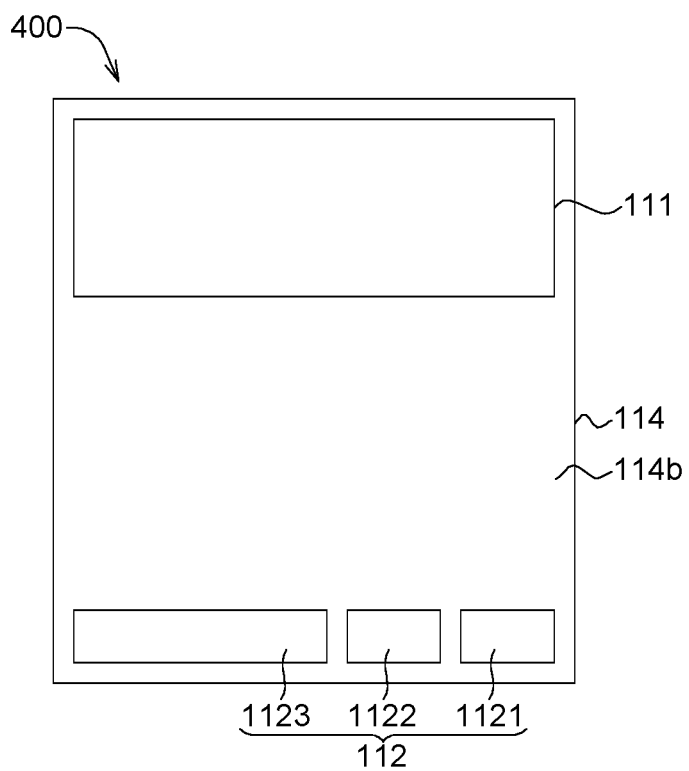
FIG. 4B illustrates a bottom view of the power device in FIG. 4A.
Figure 4C:
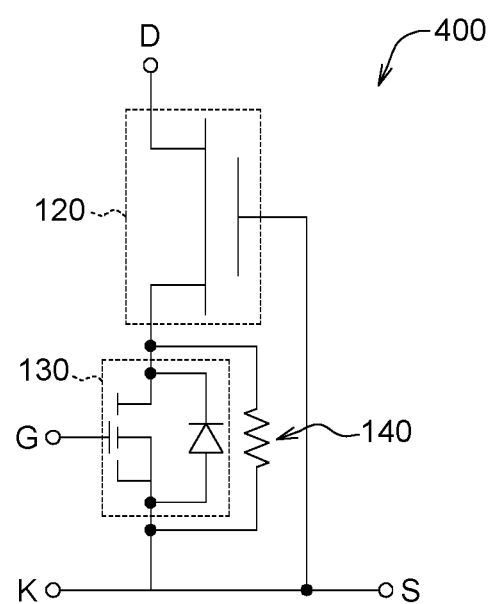
FIG. 4C illustrates an equivalent circuit diagram of the power device.

Referring to FIGS. 4A to 4C, FIG. 4A illustrates a top view of a power device 400 according to another embodiment, FIG. 4B illustrates a bottom view of the power device 400 in FIG. 4A, and FIG. 4C illustrates an equivalent circuit diagram of the power device 400.

The power device 400 includes the substrate 110, at least one first power component 120, at least one second power component 130, at least one passive electronic device 140, a plurality of bonding wires 150 and the protection layer 160. The substrate 110 includes the first metal layer 111, the second metal layer 112, the third metal layer 113, the fourth metal layer 115 and the insulation layer 114 surrounding the first metal layer 111, the second metal layer 112, the third metal layer 113 and the fourth metal layer 115. In an embodiment, the contour of the third metal layer 113 can be a rectilinear polygon. The interior angle at each vertex of the rectilinear polygon is either 90° or 270° and the number of sides in the rectilinear polygon is larger than 4.

As shown in FIG. 4A, the second metal layer 112 includes a first segment 1121, a second segment 1122 and a third segment 1123. The first segment 1121, the second segment 1122 and the third segment 1123 are separated from each other by the insulation layer 114. In the present embodiment, the first segment 1121 may serve as a gate electrode of the power device 400 in FIG. 4C, the second segment 1122 may serve as a kelvin electrode of the power device 400 in FIG. 4C, and the third segment 1123 may serve as a source electrode of the power device 400 in FIG. 4C. In addition, the first metal layer 111 may serve as a drain electrode of the power device 400 in FIG. 4C.

Figure 5A:
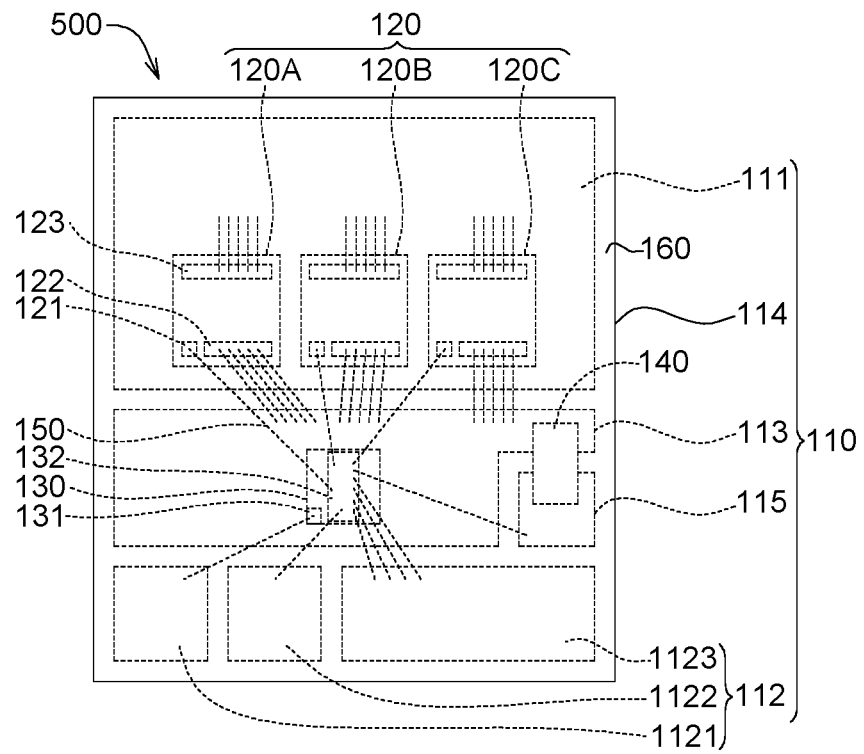
FIG. 5A illustrates a top view of a power device according to another embodiment.
Figure 5B:
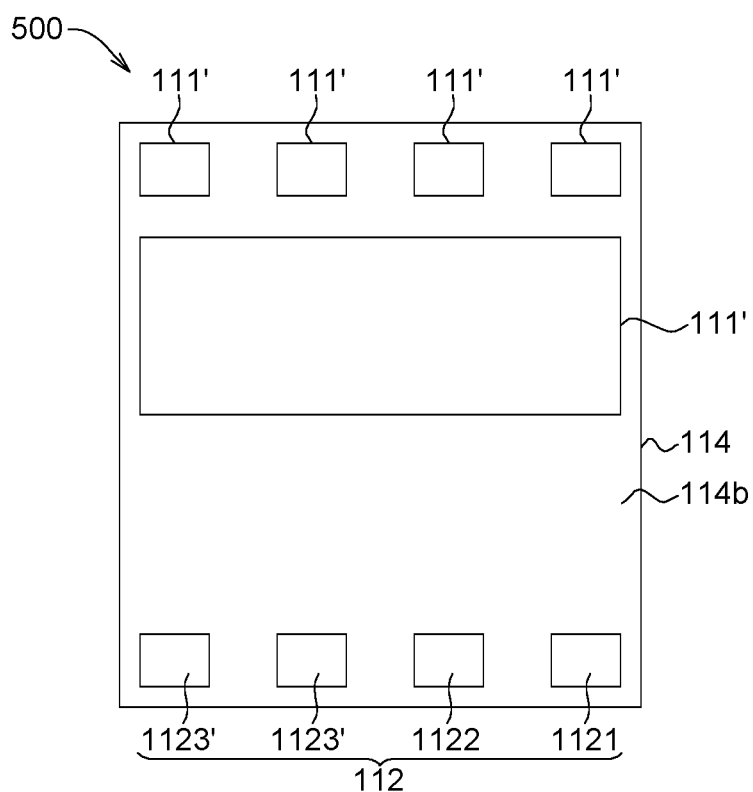
FIG. 5B illustrates a bottom view of the power device in FIG. 5A.

Referring to FIGS. 5A to 5B, FIG. 5A illustrates a top view of a power device 500 according to another embodiment, and FIG. 5B illustrates a bottom view of the power device 500 in FIG. 5A. The power device 500 has an equivalent circuit similar to or the same as that of the power device 400.

The power device 500 includes the substrate 110, at least one first power component 120, at least one second power component 130, at least one passive electronic device 140, a plurality of bonding wires 150 and the protection layer 160. The substrate 110 includes the first metal layer 111, the second metal layer 112, the third metal layer 113, the fourth metal layer 115 and the insulation layer 114 surrounding the first metal layer 111, the second metal layer 112, the third metal layer 113 and the fourth metal layer 115. In an embodiment, the contour of the third metal layer 113 can be a rectilinear polygon. The interior angle at each vertex of the rectilinear polygon is either 90° or 270° and the number of sides in the rectilinear polygon is larger than 4.

As shown in FIG. 5A, the second metal layer 112 includes the first segment 1121, the second segment 1122 and the third segment 1123. The first segment 1121, the second segment 1122 and the third segment 1123 are separated from each other by the insulation layer 114. In the present embodiment, the first segment 1121 may serve as a gate electrode, the second segment 1122 may serve as a kelvin electrode, and the third segment 1123 may serve as a source electrode. In addition, the first metal layer 111 may serve as a drain electrode.

As shown in FIG. 5B, the first metal layer 111 includes a number of contacts 111' exposed to the second surface 114b, and the contacts 111' are separated by the insulation layer 114. In addition, the third segment 1123 includes two contacts 1123' exposed to the second surface 114b and the contacts 1123' are separated by the insulation layer 114.

Figure 6A:
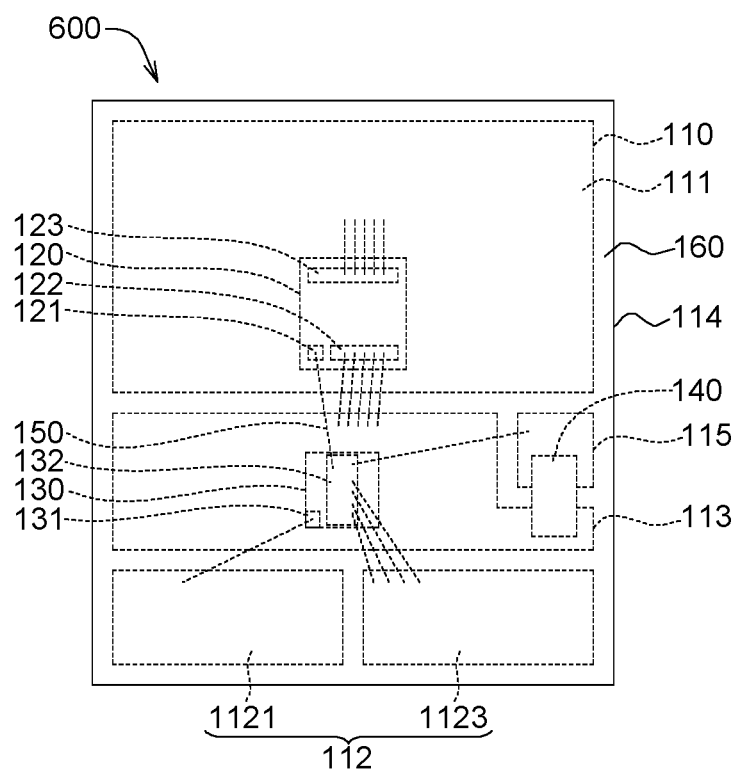
FIG. 6A illustrates a top view of a power device according to another embodiment.
Figure 6B:
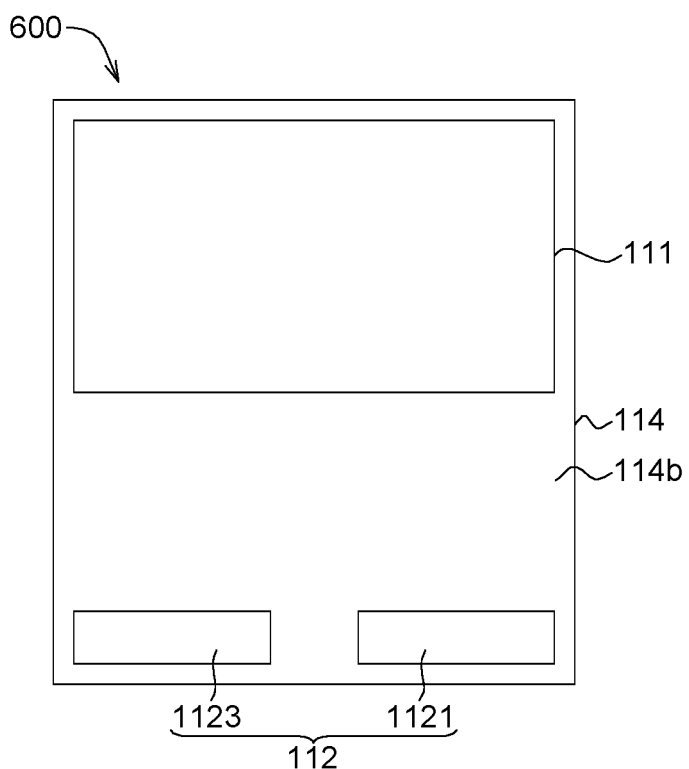
FIG. 6B illustrates a bottom view of the power device in FIG. 6A.
Figure 6C:
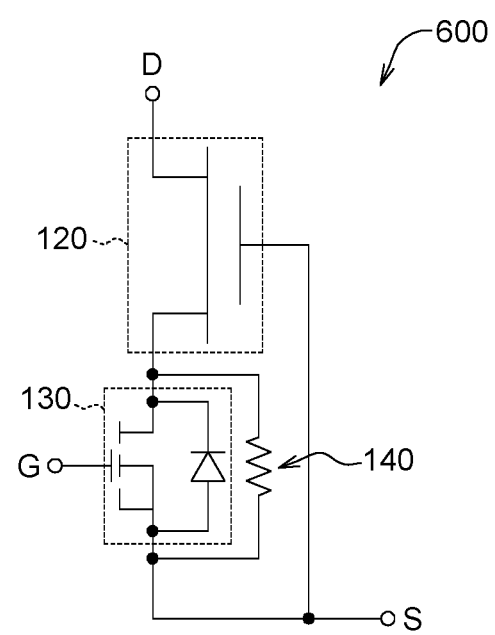
FIG. 6C illustrates an equivalent circuit diagram of the power device.

Referring to FIGS. 6A to 6C, FIG. 6A illustrates a top view of a power device 600 according to another embodiment, FIG. 6B illustrates a bottom view of the power device 600 in FIG. 6A, and FIG. 6C illustrates an equivalent circuit diagram of the power device 600.

The power device 600 includes the substrate 110, at least one first power component 120, at least one second power component 130, at least one passive electronic device 140, a plurality of bonding wires 150 and the protection layer 160. The substrate 110 includes the first metal layer 111, the second metal layer 112, the third metal layer 113, the fourth metal layer 115 and the insulation layer 114 surrounding the first metal layer 111, the second metal layer 112, the third metal layer 113 and the fourth metal layer 115. In an embodiment, the contour of the third metal layer 113 can be a rectilinear polygon. The interior angle at each vertex of the rectilinear polygon is either 90° or 270° and the number of sides in the rectilinear polygon is larger than 4.

As shown in FIG. 6A, the second metal layer 112 includes the first segment 1121 and the third segment 1123. The first segment 1121 and the third segment 1123 are separated from each other by the insulation layer 114. In the present embodiment, the first segment 1121 may serve as a gate electrode in FIG. 6C, and the third segment 1123 may serve as a source electrode in FIG. 6C. In addition, the first metal layer 111 may serve as a drain electrode in FIG. 6C. In an embodiment, the top-viewed area of the first metal layer 111 is larger than the top-viewed area of the third segment 1123, and the top-viewed area of the third segment 1123 is substantially equal to the top-viewed area of the first segment 1121.

Figure 7A:
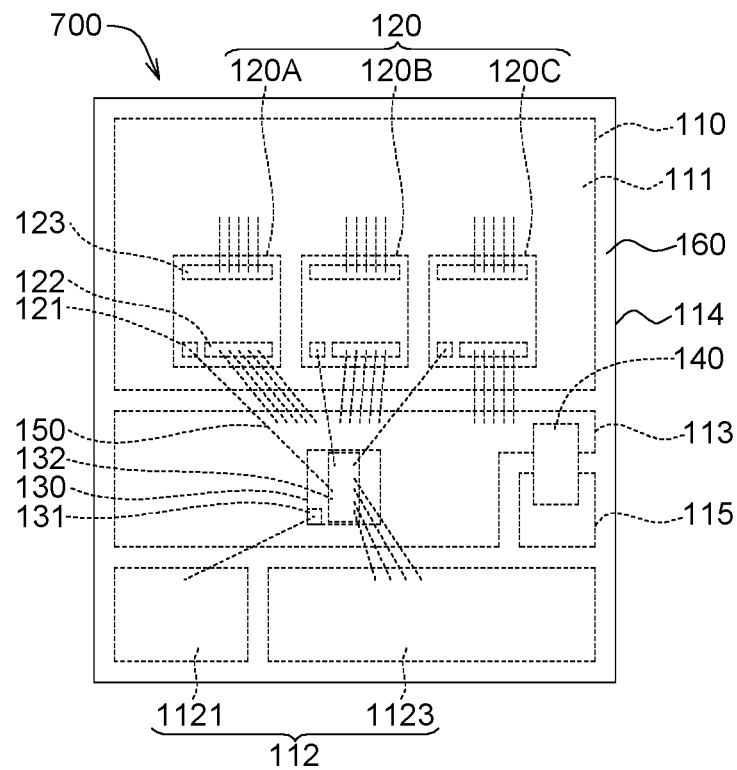
FIG. 7A illustrates a top view of a power device according to another embodiment.
Figure 7B:
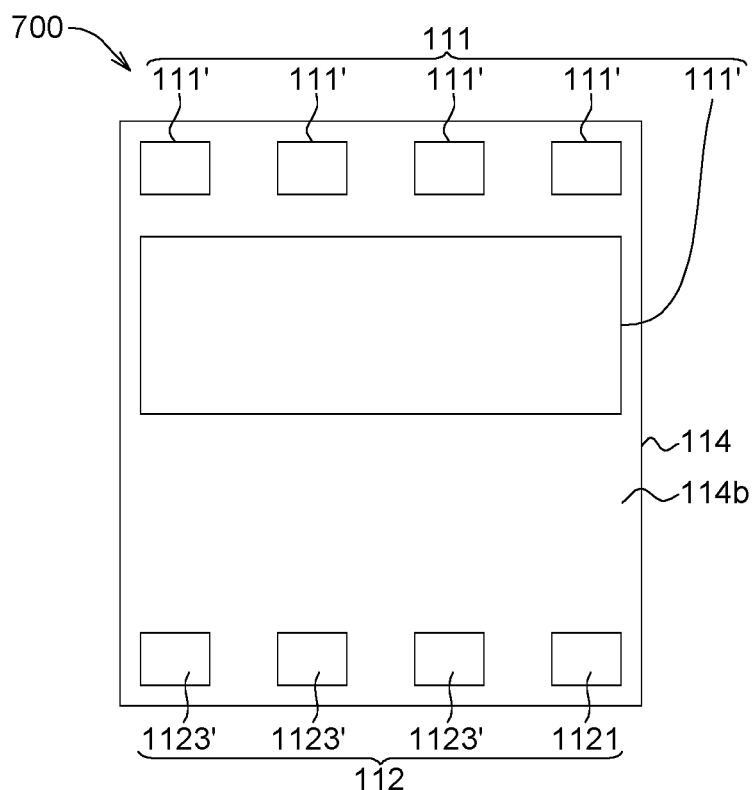
FIG. 7B illustrates a bottom view of the power device in FIG. 7A.

Referring to FIGS. 7A to 7B, FIG. 7A illustrates a top view of a power device 700 according to another embodiment, and FIG. 7B illustrates a bottom view of the power device 700 in FIG. 7A. The power device 700 has an equivalent circuit similar to or the same as that of the power device 600.

The power device 700 includes the substrate 110, at least one first power component 120, at least one second power component 130, at least one passive electronic device 140, a plurality of bonding wires 150 and the protection layer 160. The substrate 110 includes the first metal layer 111, the second metal layer 112, the third metal layer 113, the fourth metal layer 115 and the insulation layer 114 surrounding the first metal layer 111, the second metal layer 112, the third metal layer 113 and the fourth metal layer 115. In an embodiment, the contour of the third metal layer 113 can be a rectilinear polygon. The interior angle at each vertex of the rectilinear polygon is either 90° or 270° and the number of sides in the rectilinear polygon is larger than 4.

As shown in FIG. 7A, the second metal layer 112 includes the first segment 1121 and the third segment 1123. The first segment 1121 and the third segment 1123 are separated from each other by the insulation layer 114. In the present embodiment, the first segment 1121 may serve as a gate electrode and the third segment 1123 may serve as a source electrode. In addition, the first metal layer 111 may serve as a drain electrode.

As shown in FIG. 7B, the first segment 111 includes a number of contacts 111' exposed to the second surface 114b, and the contacts 111' are separated by the insulation layer 114. In addition, the third segment 1123 includes a number of contacts 1123' exposed to the second surface 114b and the contacts 1123' are separated by the insulation layer 114.

Figure 8A:
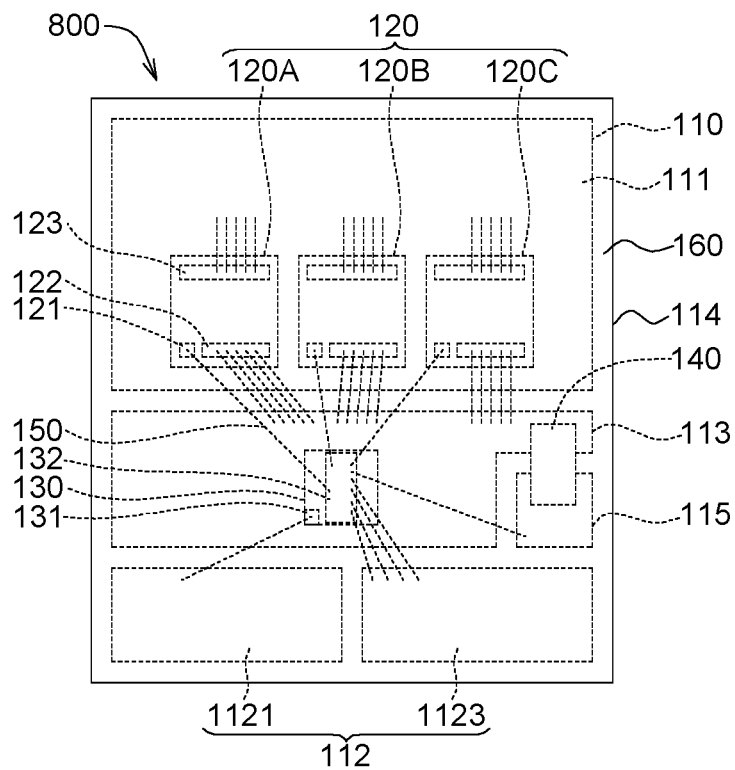
FIG. 8A illustrates a top view of a power device according to another embodiment.
Figure 8B:
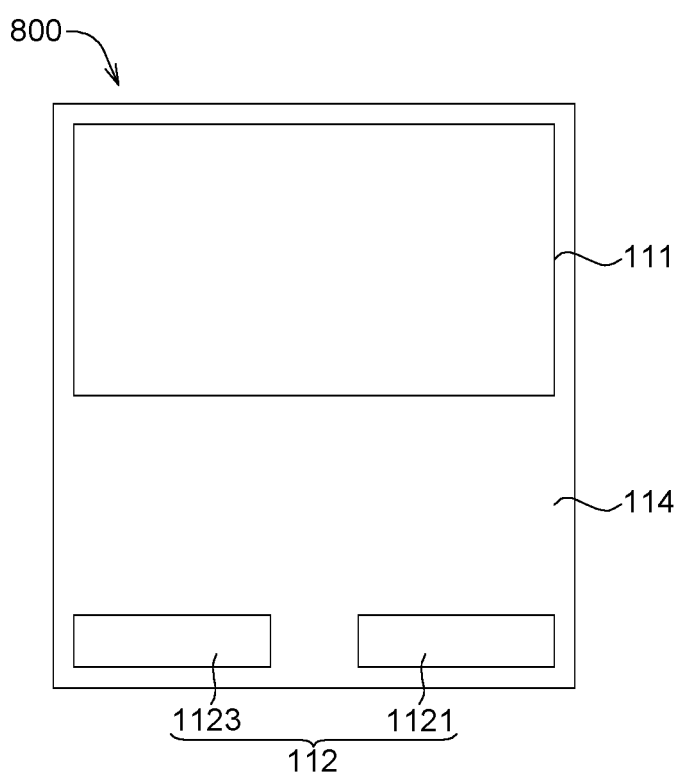
FIG. 8B illustrates a bottom view of the power device in FIG. 8A.

Referring to FIGS. 8A to 8B, FIG. 8A illustrates a top view of a power device 800 according to another embodiment, and FIG. 8B illustrates a bottom view of the power device 800 in FIG. 8A. The power device 800 has an equivalent circuit similar to or the same as that of the power device 600.

The power device 800 includes the substrate 110, at least one first power component 120, at least one second power component 130, at least one passive electronic device 140, a plurality of bonding wires 150 and the protection layer 160. The substrate 110 includes the first metal layer 111, the second metal layer 112, the third metal layer 113, the fourth metal layer 115 and the insulation layer 114 surrounding the first metal layer 111, the second metal layer 112, the third metal layer 113 and the fourth metal layer 115. In an embodiment, the contour of the third metal layer 113 can be a rectilinear polygon. The interior angle at each vertex of the rectilinear polygon is either 90° or 270° and the number of sides in the rectilinear polygon is larger than 4.

As shown in FIG. 8A, the second metal layer 112 includes the first segment 1121 and the third segment 1123. The first segment 1121 and the third segment 1123 are separated from each other by the insulation layer 114. In the present embodiment, the first segment 1121 may serve as a gate electrode, and the third segment 1123 may serve as a source electrode. In addition, the first metal layer 111 may serve as a drain electrode.

Figure 9A:
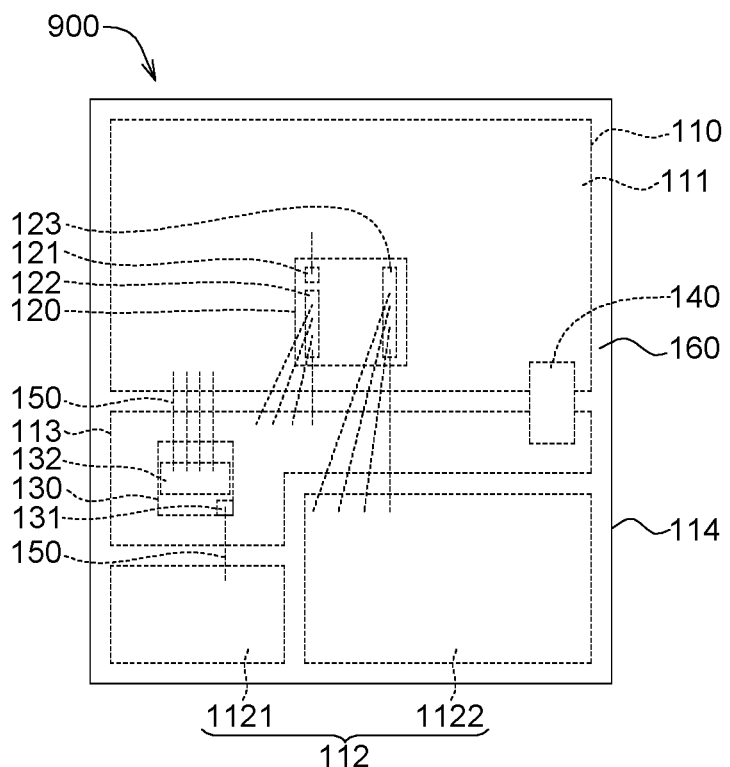
FIG. 9A illustrates a top view of a power device according to another embodiment.
Figure 9B:
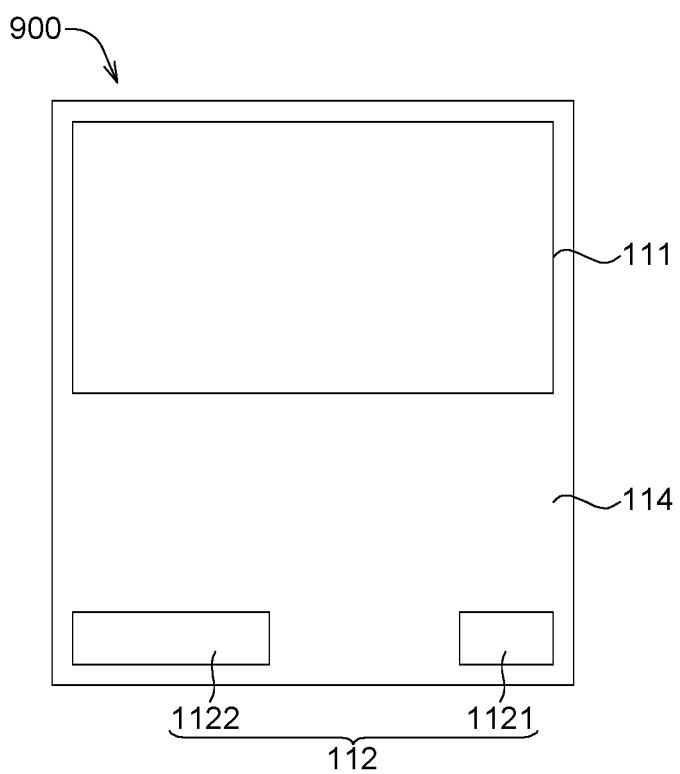
FIG. 9B illustrates a bottom view of the power device in FIG. 9A.
Figure 9C:
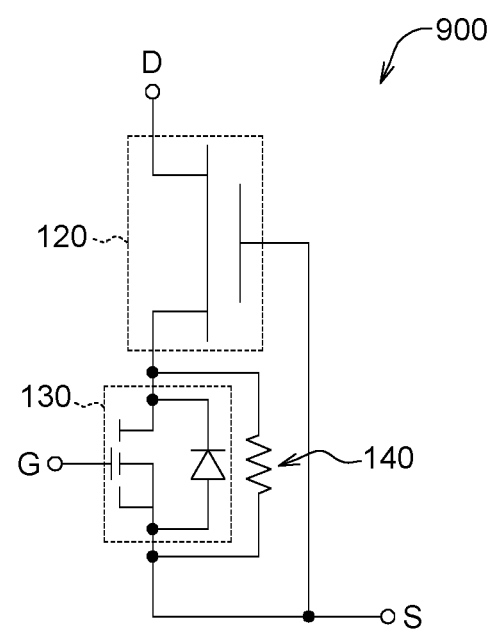
FIG. 9C illustrates an equivalent circuit diagram of the power device.

Referring to FIGS. 9A to 9C, FIG. 9A illustrates a top view of a power device 900 according to another embodiment, FIG. 9B illustrates a bottom view of the power device 900 in FIG. 9A, and FIG. 9C illustrates an equivalent circuit diagram of the power device 900.

The power device 900 includes the substrate 110, at least one first power component 120, at least one second power component 130, at least one passive electronic device 140, a plurality of bonding wires 150 and the protection layer 160. The substrate 110 includes the first metal layer 111, the second metal layer 112, the third metal layer 113 and the insulation layer 114 surrounding the first metal layer 111, the second metal layer 112 and the third metal layer 113. In an embodiment, the contour of the third metal layer 113 can be a rectilinear polygon. The interior angle at each vertex of the rectilinear polygon is either 90° or 270° and the number of sides in the rectilinear polygon is larger than 4.

As shown in FIG. 9A, the second metal layer 112 includes the first segment 1121 and the second segment 1122. The first segment 1121 and the second segment 1122 are separated from each other by the insulation layer 114. In the present embodiment, the first segment 1121 may serve as a gate electrode in FIG. 9C, and the second segment 1122 may serve as drain electrode in FIG. 9C. In addition, the first metal layer 111 may serve as a source electrode in FIG. 9C.

Figure 10A:
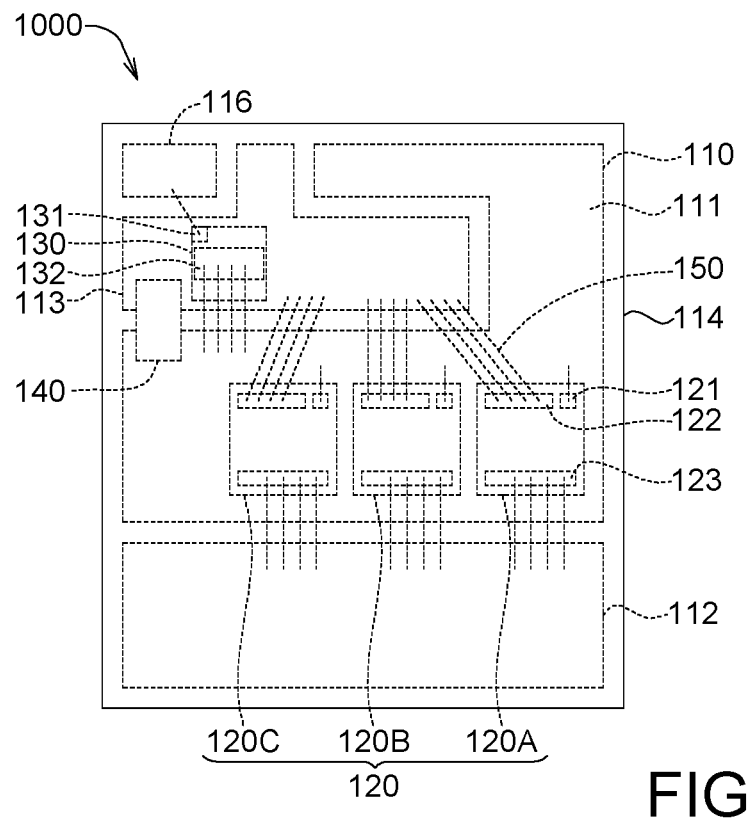
FIG. 10A illustrates a top view of a power device according to another embodiment.
Figure 10B:
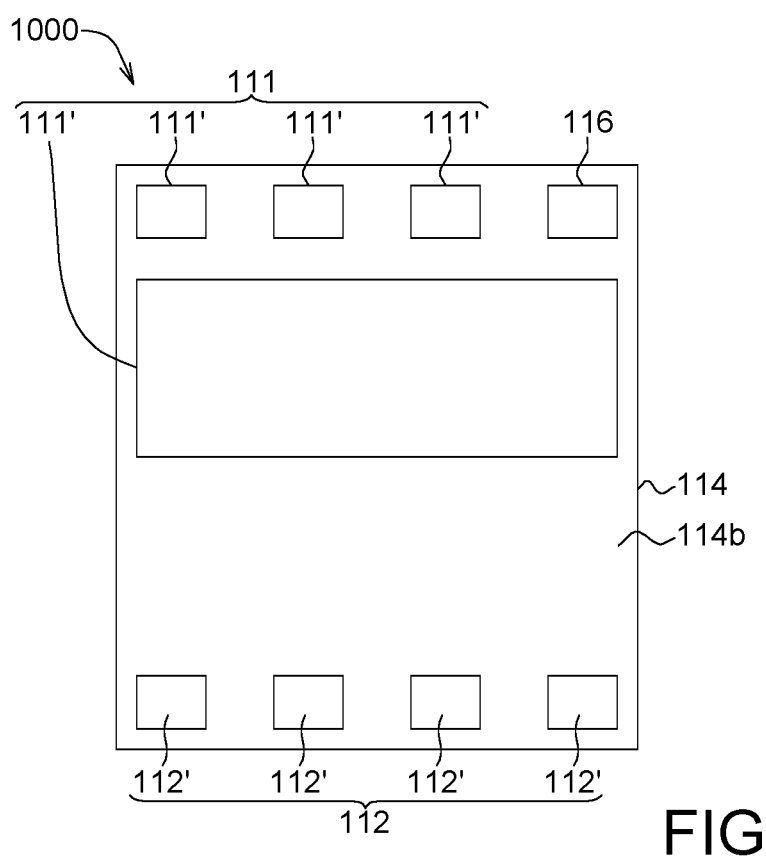
FIG. 10B illustrates a bottom view of the power device in FIG. 10A.

Referring to FIGS. 10A to 10B, FIG. 10A illustrates a top view of a power device 1000 according to another embodiment, and FIG. 10B illustrates a bottom view of the power device 1000 in FIG. 10A. The power device 1000 has an equivalent circuit similar to or the same as that of the power device 900.

The power device 1000 includes the substrate 110, at least one first power component 120, at least one second power component 130, at least one passive electronic device 140, a plurality of bonding wires 150 and the protection layer 160. The substrate 110 includes the first metal layer 111, the second metal layer 112, the third metal layer 113, a fifth metal layer 116 and the insulation layer 114 surrounding the first metal layer 111, the second metal layer 112, the third metal layer 113 and the fifth metal layer 116. In an embodiment, the shape of the third metal layer 113 can be a rectilinear polygon. The interior angle at each vertex of the rectilinear polygon is either 90° or 270° and the number of sides in the rectilinear polygon is larger than 4.

As shown in FIG. 10A, in the present embodiment, the fifth metal layer 116 may serve as a gate electrode and the first metal layer 111 may serve as a source electrode. In addition, the second metal layer 112 may serve as a drain electrode. In an embodiment, in a top view, the top-viewed area of the first metal layer 111 is larger than a top-viewed area of the second metal layer 112, and the top-viewed area of the second metal layer 112 is larger than the top-viewed area of the fifth metal layer 116.

As shown in FIG. 10B, the first metal layer 111 includes a number of contacts 111' exposed to the second surface 114b, and the contacts 111' are separated by the insulation layer 114. In addition, the second metal layer 112 includes a number of contacts 112' exposed to the second surface 114b and the contacts 112' are separated by the insulation layer 114.

FIGS. 11A to 11E illustrate manufacturing processes of the power device 100 in FIG. 1A.

Figure 11A:
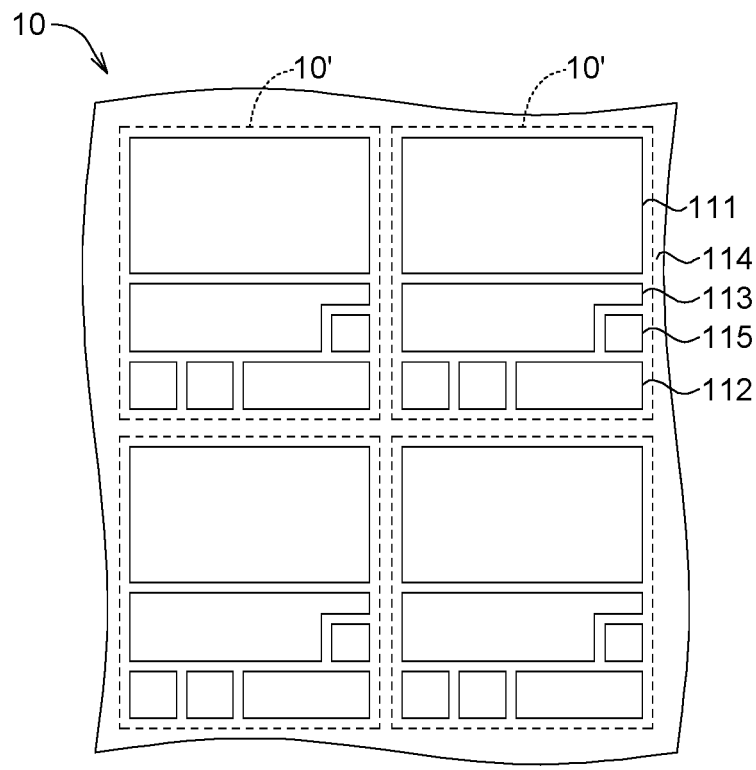
FIGS. 11A to 11E illustrate manufacturing processes of the power device in FIG. 1A.

As shown in FIG. 11A, a substrate 10 is provided. The substrate 10 includes a plurality of substrate units 10'. Each substrate unit 10' includes the first metal layer 111, the second metal layer 112, the third metal layer 113, the fourth metal layer 115 and the insulation layer 114 surrounding the first metal layer 111, the second metal layer 112, the third metal layer 113 and the fourth metal layer 115.

Figure 11B:
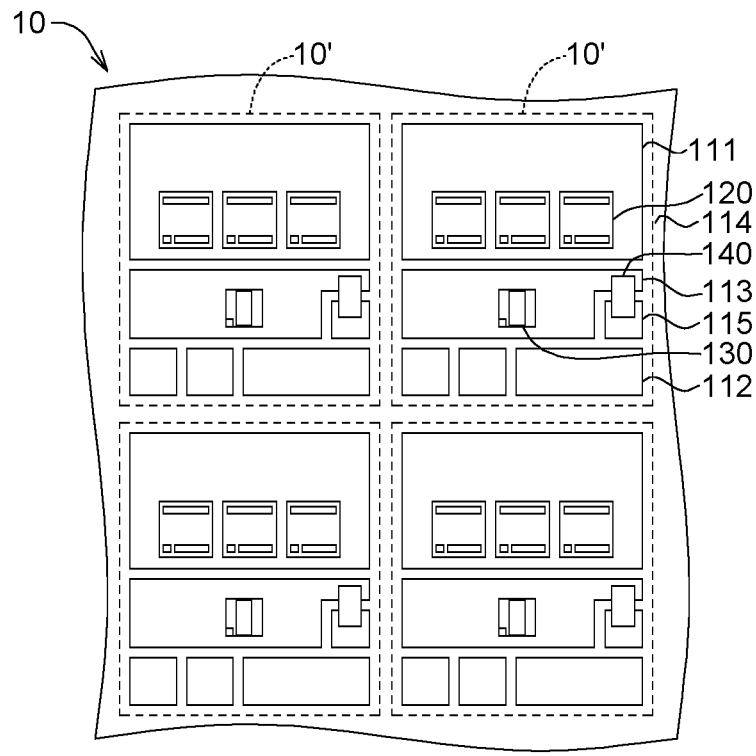

Then, as shown in FIG. 11B, at least one first power component 120, at least one second power component 130 and at least one passive electronic device 140 are disposed on each substrate unit 10' by surface-mount technology (SMT), wherein the first power component 120 is disposed on the first metal layer 111 exposed to the first surface 114u (not illustrated), the second power component 130 is disposed on the third metal layer 113 exposed to the first surface 114u (not illustrated), and the passive electronic device 140 is disposed above and on the third metal layer 113 and the fourth metal layer 115. The first power component 120 is connected to the substrate unit 10' through an adhesive layer, which is conductive or insulated. The second power component 130 and the passive electronic device 140 are connected to the substrate unit 10' through a conductive adhesive layer. In an embodiment, the passive electronic device is a resistor.

Figure 11C:
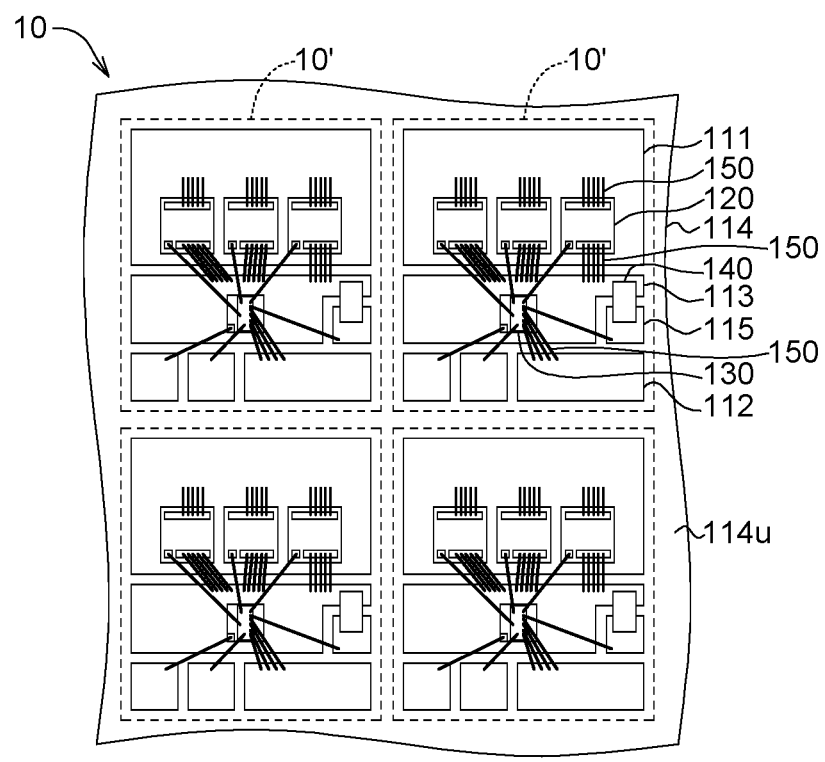

Then, as shown in FIG. 11C, in each substrate unit 10', the first power component 120, the second power component 130, the first metal layer 111, the second metal layer 112 and the third metal layer 113 are electrically connected by the bonding wires 150.

Figure 11D:
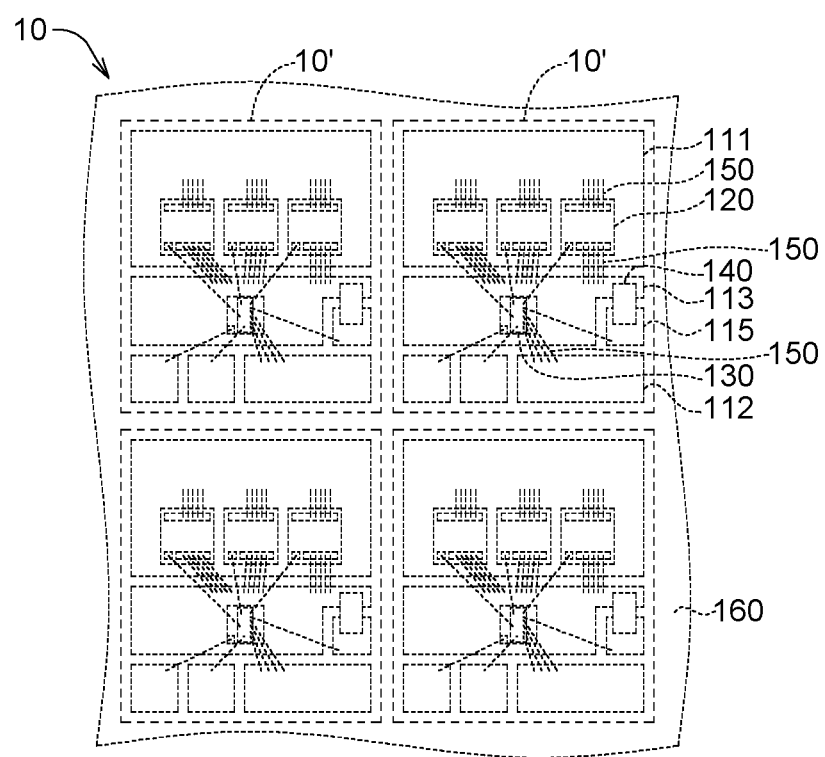

Then, as shown in FIG. 11D, the protection layer 160 is formed, by dispensing, to cover the first power components 120, the second power components 130, the passive electronic device 140, the first metal layer 111, the second metal layer 112, the third metal layer 113, the first surface 114u (illustrated in FIG. 11C) of the insulation layer 114, the fourth metal layer 115 and the bonding wires 150.

Figure 11E:
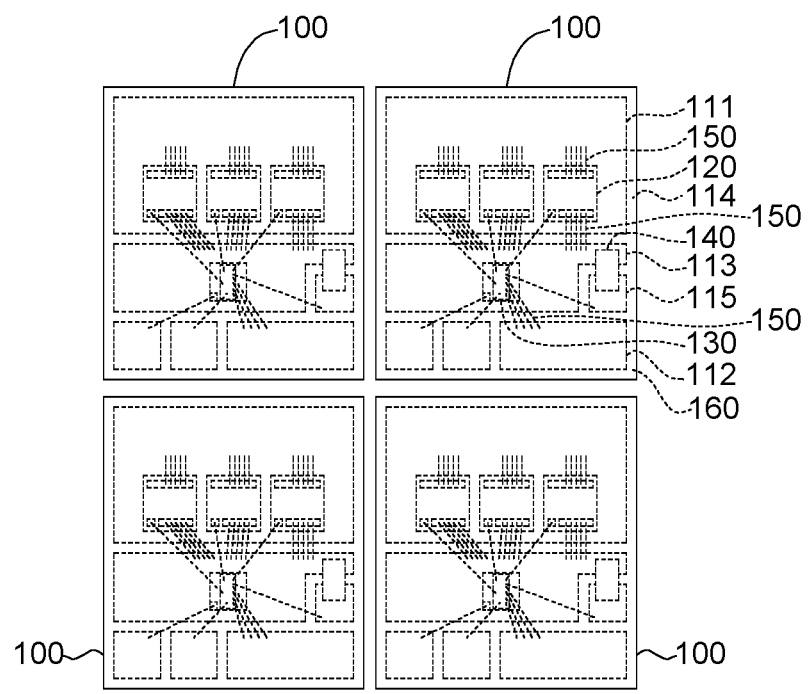

Then, as shown in FIG. 11E, the substrate 10 is diced to separate the substrate units 10' (illustrated in FIG. 11D). Each substrate units 10' is the power device 100 as shown in FIG. 1A.

FIGS. 12A to 12E illustrate manufacturing processes of the power device 200 in FIG. 2A.

As shown in FIG. 12A, a metal substrate 110' is provided.

Then, referring to FIGS. 12B1 to 12B3, FIG. 12B1 illustrates a top view of the metal substrate 110' in FIG. 12A being etched, FIG. 12B2 illustrates a bottom view of the metal substrate 110' in FIG. 12B1, and FIG. 12B3 illustrates a cross sectional view of the metal substrate 110' in FIG. 12B2 along a direction 12B3-12B3'.

The metal substrate 110' is half-etched to form the cavity R1, the first metal layer 111, the second metal layer 112, the third metal layer 113, the fourth metal layer 115 and a connecting frame 110R, wherein the connecting frame 110R connects the first metal layer 111, the second metal layer 112, the third metal layer 113 and the fourth metal layer 115, such that the first metal layer 111, the second metal layer 112, the third metal layer 113 and the fourth metal layer 115 are not separated from each other. The cavity R1 extends toward the first surface 113*u* of the third metal layer 113 from the second surface 111*b* of the first metal layer 111 and the second surface 112*b* of the second metal layer 112. The bottom surface R1*b* of the cavity R1 is spaced from the second surface 111*b* of the first metal layer 111 and the second surface 112*b* of the second metal layer 112.

Figure 12C:
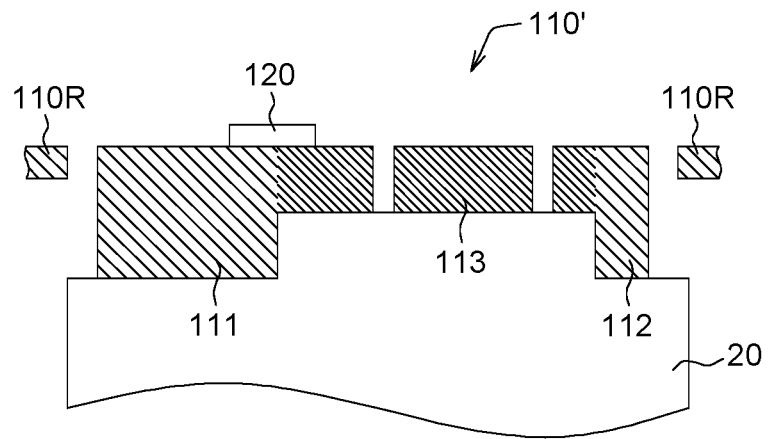

Then, as shown in FIG. 12C, at least one first power component 120, at least one second power component 130 (not illustrated) and at least one passive electronic device 140 (not illustrated) are disposed on metal substrate 110' by SMT, wherein the first power component 120 is disposed on the first metal layer 111, the second power component 130 (not illustrated) is disposed on the third metal layer 113, and the passive electronic device 140 (not illustrated) is disposed above and on the third metal layer 113 and the fourth metal layer 115.

After etching the metal substrate 110', the metal substrate 110' may be placed on a jig 20 to support the metal substrate 110' in the following process. Therefore, the power component can be steadily disposed on the metal substrate 110' without bending or breaking the metal substrate 110'. In another embodiment, an insulation material is provided to fill the metal substrate 110' as a support in the following process. The insulation material is provided to fill the metal substrate 110' from the back side of the metal substrate 110' without covering or overlapping with the top surface (such as the first surface 114*u* shown in FIG. 1C) and exposing a part of the bottom surface (such as the second surface 114*b* shown in FIG. 1C) for electrical connection.

Then, the first power component 120, the second power component 130 (not illustrated), the first metal layer 111, the second metal layer 112 and the third metal layer 113 are electrically connected by the bonding wires 150 (not illustrated).

Figure 12D:
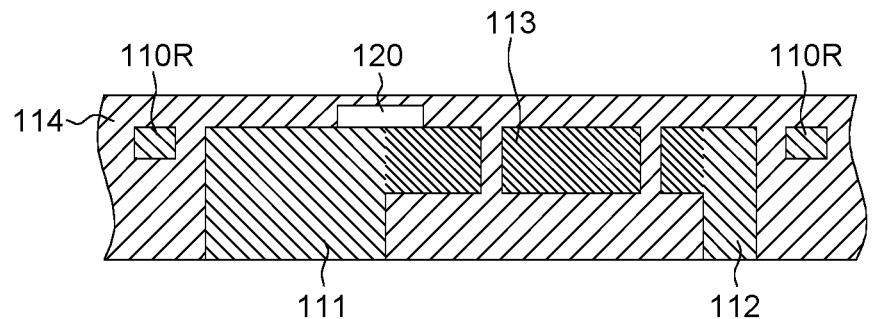

Then, as shown in FIG. 12D, the insulation layer 114 is formed, by molding technology, to encapsulate the first metal layer 111, the second metal layer 112, the third metal layer 113, the fourth metal layer 115, the first power component 120, the second power component 130 and the passive electronic device 140.

Figure 12E:
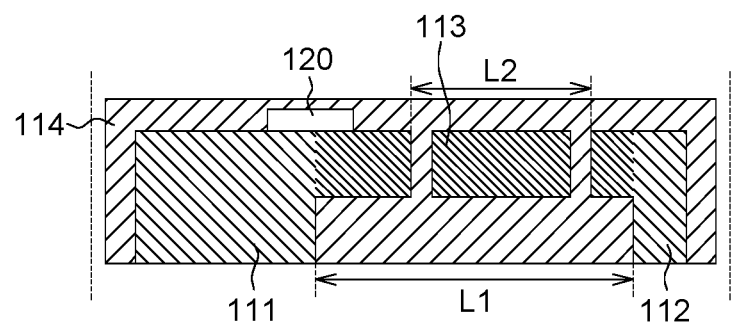

Then, as shown in FIG. 12E, the structure in FIG. 12D is diced to form the power device 200 as shown in FIG. 2C, wherein the connecting frame 110R is removed.

In an embodiment, the metal layer in the present disclosure has one or more corner having a round shape with a curvature radius not larger than 5 mm.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A power device, comprising:
a substrate comprising a first metal layer, a second metal layer, a third metal layer and an insulation layer surrounding the first metal layer, the second metal layer and the third metal layer, wherein the third metal layer is between the first metal layer and the second metal layer, the insulation layer has a first surface and a second surface opposite to the first surface;
a first power component electrically connected to the first metal layer and electrically connected to a surface of the third metal layer;
a second power component electrically connected to the second metal layer and electrically connected to the surface of the third metal layer; and
a passive electronic device disposed on the third metal layer,
wherein the first metal layer exposed to the second surface is separated from the second metal layer exposed to the second surface by a first shortest distance, the first metal layer exposed to the first surface is separated from the second metal layer exposed to the first surface by a second shortest distance, and a ratio value of the first shortest distance to the second shortest distance ranges between 1.25 and 1.4.

2. The power device according to claim 1, wherein the first power component is a high electron mobility transistor (HEMT), and the second power component is a metal-oxide-semiconductor FET (MOSFET).

3. The power device according to claim 2, wherein the first power component and the second power component are arranged in a cascode configuration.

4. The power device according to claim 1, wherein the substrate further comprises a fourth metal layer, and the passive electronic device is disposed above the fourth metal layer and the third metal layer, and electrically connected to the third metal layer and the fourth metal layer.

5. The power device according to claim 1, wherein the third metal layer is exposed to the first surface, but is not exposed to the second surface.

6. The power device according to claim 1, wherein the insulation layer is a molding compound.

7. The power device according to claim 1, wherein the substrate is a pre-molding substrate.

8. The power device according to claim 1, wherein the first metal layer, the second metal layer and the third metal layer each have a lateral surface, and the insulation layer covers the entirety of the lateral surfaces.

9. The power device according to claim 1, wherein the first metal layer has a first area exposed to the first surface and a second area exposed to the second surface, and the first area is larger than the second area.

10. The power device according to claim 1, wherein the first power component is disposed on the first metal layer, and electrically connected to the third metal layer by a bonding wire.

11. The power device according to claim 1, wherein the second power component is disposed on the third metal layer, and electrically connected to the second metal layer by a bonding wire.

12. A manufacturing method of a power device, comprising:
provide a substrate, wherein the substrate comprises a first metal layer, a second metal layer, a third metal layer between the first metal layer and the second metal layer, and an insulation layer surrounding the first metal layer, the second metal layer and the third metal layer, wherein the insulation layer has a first surface and a second surface opposite to the first surface, wherein the first metal layer exposed to the second surface is separated from the second metal layer exposed to the second surface by a first shortest distance, the first metal layer exposed to the first surface is separated from the second metal layer exposed to the first surface by a second shortest distance, and a ratio value of the first shortest distance to the second shortest distance ranges between 1.25 and 1.4;
disposing a first power component to be electrically connected to the first metal layer and electrically connected to a surface of the third metal layer;
disposing the first power component on the first metal layer;
electrically connecting the first power component with the third metal layer by a bonding wire; and
disposing a second power component to be electrically connected to the second metal layer and electrically connected to the surface of the third metal layer.

13. The manufacturing method according to claim 12, wherein the step of disposing the second power component to be electrically connected to the second metal layer comprises:
disposing the second power component on the third metal layer; and
electrically connecting the second power component with the second metal layer by a bonding wire.

14. The manufacturing method according to claim 12, further comprising:
disposing a passive electronic device on the third metal layer.

15. A manufacturing method of a power device, comprising:
providing a metal substrate;
etching the metal substrate to form a first metal layer, a second metal layer and a third metal layer between the first metal layer and the second metal layer;
disposing a first power component to be electrically connected to the first metal layer and electrically connected to a surface of the third metal layer;
disposing the first power component on the first metal layer;
electrically connecting the first power component with the third metal layer by a bonding wire;
disposing a second power component to be electrically connected to the second metal layer and electrically connected to the surface of the third metal layer; and
forming an insulation layer surrounding the first metal layer, the second metal layer and the third metal layer,
wherein the insulation layer has a first surface and a second surface opposite to the first surface, and
wherein the first metal layer exposed to the second surface is separated from the second metal layer exposed to the second surface by a first shortest distance, the first metal layer exposed to the first surface is separated from the second metal layer exposed to the first surface by a second shortest distance, and a ratio value of the first shortest distance to the second shortest distance ranges between 1.25 and 1.4.

16. The manufacturing method according to claim 15, wherein the step of disposing the second power component to be electrically connected to the second metal layer comprises:
disposing the second power component on the third metal layer; and
electrically connecting the second power component with the second metal layer by a bonding wire.

17. The manufacturing method according to claim 15, further comprises:
disposing a passive electronic device on the third metal layer.

* * * * *